United States Patent

Willsch et al.

[11] Patent Number: 6,154,022
[45] Date of Patent: Nov. 28, 2000

[54] OPTICAL MEASURING METHOD AND OPTICAL MEASURING DEVICE FOR MEASURING AN ALTERNATING MAGNETIC FIELD HAVING INTENSITY NORMALIZATION

[75] Inventors: Michael Willsch, Fürth; Thomas Bosselmann, Erlangen; Stefan Hain, Effeltrich, all of Germany

[73] Assignee: Siemens AG, Munich, Germany

[21] Appl. No.: 09/077,762
[22] PCT Filed: Nov. 22, 1996
[86] PCT No.: PCT/DE96/02248
  § 371 Date: Jun. 2, 1998
  § 102(e) Date: Jun. 2, 1998
[87] PCT Pub. No.: WO97/21108
  PCT Pub. Date: Jun. 12, 1997

[30] Foreign Application Priority Data

Dec. 7, 1995 [DE] Germany .......................... 195 45 759

[51] Int. Cl.⁷ ..................................................... G01R 31/00
[52] U.S. Cl. .................... 324/96; 324/117 R; 324/244.1; 250/225
[58] Field of Search ................................... 324/96, 244.1, 324/117 R, 73.1, 244, 130; 73/516 CM; 250/222.12, 225

[56] References Cited

U.S. PATENT DOCUMENTS 4,916,387  4/1990  Miller ........................................ 324/96
5,844,409  12/1998  Bosselmann et al. ..................... 324/96
6,034,523  3/2000  Bosselmann et al. .............. 324/117 R

FOREIGN PATENT DOCUMENTS 0 557 090  8/1993  European Pat. Off. .
44 43 948  6/1996  Germany .
44 46 425  6/1996  Germany .
WO 92/13280  8/1992  WIPO .
WO 95/10045  4/1995  WIPO .

OTHER PUBLICATIONS

"Transmission Loss Compensation for Faraday Effect Fibre Optic Sensors,"0 H. Sohlstrom et al., Book of Abstracts, Eurosensors VIII conference, Toulouse, France, Sep. 25–28, 1994, p. 102.

"Transmission Loss Compensation for Faraday Effect Fibre Optic Sensors," U. Holm et al., Sensors and Actuators A, Elsevier Science S.A., 1995, vol. 46–47, pp. 487–490.

"Optical Combined Current & Voltage H.V. Sensors," GEC Alsthom T&D.

"A Reciprocal–Compensated Fiber–Optic Electric Current Sensor," X. Fang et al., IEEE, Journal of Lightwave Technology, Oct. 1994, vol. 12, No. 10, pp. 1882–1890.

Primary Examiner—Hezron Williams
Assistant Examiner—Anthony Jolly
Attorney, Agent, or Firm—Kenyon & Kenyon

[57] ABSTRACT

In mutually opposite directions, two light signals traverse an optical series circuit including a first multi-mode fiber, a first polarizer, a Faraday sensor device, a second polarizer and a second multi-mode fiber. An intensity-normalized measuring signal is derived with the aid of direct signal components from light intensities of the two light signals after traversal of the series circuit.

12 Claims, 2 Drawing Sheets

OPTICAL MEASURING METHOD AND OPTICAL MEASURING DEVICE FOR MEASURING AN ALTERNATING MAGNETIC FIELD HAVING INTENSITY NORMALIZATION

FIELD OF THE INVENTION

The present invention relates to a method and an arrangement for measuring an alternating magnetic field.

BACKGROUND OF THE INVENTION

An alternating magnetic field is a magnetic field which has in its frequency spectrum only frequency components differing from 0, and is thus, in particular, temporally variable.

Conventional optical measuring arrangements and measuring methods measure a magnetic field using the magnetooptic Faraday effect. The Faraday effect is the rotation of the plane of polarization of linearly polarized light as a function of a magnetic field. The rotational angle is proportional to the path integral over the magnetic field along the path covered by the light, with the Verdet's constant as the constant of proportionality. The Verdet's constant is generally a function of material, temperature and wavelength. A Faraday sensor device comprising an optically transparent material such as, for example, glass is arranged in the magnetic field for the purpose of measuring the latter. The magnetic field causes a rotation of the plane of polarization of linearly polarized light, transmitted by the Faraday sensor device, by a rotational angle which can be evaluated for a measuring signal. Such magnetooptic measuring methods and measuring arrangements are may to be used to measure electric currents. The Faraday sensor arrangement is arranged for this purpose in the vicinity of an electric conductor, and detects the magnetic field generated by a current in the electric conductor. In general, the Faraday sensor device surrounds the electric conductor, so that the measuring light runs round the electric conductor in a closed path. The absolute value of the rotational angle is in the current to be measured. The Faraday sensor device can be constructed as a solid glass ring around the electric conductor, or else can surround the electric conductor in the form of a measuring coil comprising a light-conducting fiber (fiber coil) with at least one turn.

The advantages of magnetooptic measuring arrangements and measuring methods by comparison with conventional inductive current transformers are the electrical isolation and the insensitivity with respect to electromagnetic interference. However, temperature influences, and in particular influences of mechanical bending and vibration in the sensor device and the optical transmission links, in particular optical fibers for transmitting the measuring light, present problems.

International Patent Application No. WO 95/10045 describes a conventional device where two lineraly polarized light signals are transmitted in opposite directions through a Faraday sensor device. The Faraday sensor device surrounds an electric conductor, and has a circular birefringence which is negligible by comparison with the Faraday effect. After traversing the sensor device, each of the two light signals is decomposed by a polarizing beam splitter into two mutually perpendicular linearly polarized component light signals. For each light signal, an intensity-normalized signal is formed, which corresponds to the quotient of a difference and the sum of the two associated component light signals. A signal processor derives from the two intensity-normalized signals a measuring signal for an electric current in the electric conductor, the signal being virtually independent both of the temperature and of vibrations in the sensor device.

In three other conventional devices, two light signals traverse an optical series circuit comprising a first optical fiber, a first polarizer, a Faraday sensor device, a second polarizer and a second optical fiber, doing so in mutually opposite directions of circulation. After traversing the optical series circuits, the two light signals are transformed into an electric intensity signal in each case by appropriate photoelectric transducers.

In one conventional measuring system described in U.S. Pat. No. 4,916,387, a solid glass ring which surrounds the electric conductor is provided as Faraday sensor device. The axes of polarization of the two polarizers are rotated by an angle of 45° relative to one another. In order to compensate for undesired changes in intensity in the optical supply fibers, it is assumed in measuring system that the undesired changes in intensity (noise) and the changes in intensity owing to the Faraday effect are superimposed on one another additively with different signs in the two electric intensity signals, and can thus be separated from one another.

In a second conventional measuring system, described in *Journal of Lightwave Technology*, Vol.12, No.10, Oct. 1994, pages 1882 to 1890, a fiber coil comprising a single-mode fiber with low birefringence is provided as Faraday sensor device. The axes of polarization of the two polarizers enclose with one another a polarizer angle differing from 0°, which is preferably 45°. Light from a light source is split into two light signals, and these two light signals are respectively launched into the Faraday fiber coil via an optical coupler and an assigned transmitting optical fiber at opposite ends. A measuring signal which corresponds to the quotient (I1−I2)/(I1+I2) of the difference and the sum of the two intensity signals is derived from two electric intensity signals I1 and I2 which correspond to the light intensities of the two light signals after traversal of the series circuit. The attenuations of the two optical fibers can essentially be compensated thereby. The light intensities of the two light signals upon launching into the series circuit must, however, be set to be exactly equal.

In a third conventional magnetooptic measuring system, described in H. Sohlström et al, "Transmission loss compensation for Faraday effect fiber optic sensors", Conference Eurosensors VIII, Toulouse, 25.-28.9.1994 an optical series circuit comprising a first arrangement, a second polarizer and a second multimode fiber are connected between two infrared light-emitting diodes. The two light-emitting diodes are operated alternately as light source and as photodetector. Thus, at any given instant only one of the two oppositely directed light signals is traversing the series circuit. The switching clock frequency is therefore selected to be as high as possible.

In the three conventional measuring systems described above a measuring signal (intensity-normalized measuring signal) is derived which is independent of intensity losses in the common light path for the two oppositely directed light signals. It is assumed in this case that these intensity losses are equal for both light signals, and that the common light path is therefore reciprocal.

A magnetooptic current transformer is described in "*Optical Combined Current & Voltage H.V. Sensors, GEC Alsthom, T&D*", Here, a light signal linearly polarized in a polarizer traverses a Faraday glass ring and thereafter is split by a polarizing beam splitter into two component light signals linearly polarized perpendicular to one another (two-channel polarization evaluation). The two component light signals are fed, in each case, via one optical fiber to an associated photodiode which converts the corresponding component light signal into an electrical intensity signal S1 or S2 which is proportional to the light intensity of the associated component light signal.

Owing to different attenuation in the two optical fibers, the two constants of proportionality can now be different from one another. A special control is provided for the purpose of compensating these differences in sensitivity. A controllable first amplifier connected downstream of the first photodiode amplifies the intensity signal S1 by an associated gain factor K1, and a second amplifier connected downstream of the second photodiode amplifies the second intensity signal S2 by a second gain factor K2. Direct signal components (DC values) of the two intensity signals S1 and S2 are now determined, and the difference between the two direct signal components is controlled as control variable to zero by controlling the gain factor K1 of the first amplifier. A measuring signal which corresponds to the quotient $[(K1 \cdot S1)-(K2 \cdot S2)]/[(K1 \cdot S1)+(K2 \cdot S2)]$ of the difference and the sum of the output signals of the amplifiers is now formed from the two intensity signals $K1 \cdot S1$ and $K2 \cdot S2$, generally amplified at different strengths, at the outputs of the two amplifiers.

SUMMARY OF THE INVENTION

An object of the present invention is to provide a measuring method and a measuring arrangement for measuring an alternating magnetic field and in particular for measuring an alternating electric current using the Faraday effect, in which method and arrangement undesired changes in intensity in the measuring signal are largely eliminated.

This object is achieved according to the present invention by providing a system in which two light signals traverse an optical series circuit comprising a first optical transmission link, a first polarizer, a Faraday sensor device, a second polarizer and a second optical transmission link in mutually opposite traversal directions. An intensity-normalized measuring signal for the alternating magnetic field is derived from the light intensities of the two light signals after traversal of the optical series circuit and direct components of the two light intensities.

The present invention is based, in this case, on the finding that the light path formed by the optical series circuit and traversed in common by the two oppositely directed light signals is not reciprocal. The changes in intensity, in particular attenuations, experienced by the two light signals in the series circuit are thus, in contrast with the assumptions made in the prior art, not equal. The causes of such non-reciprocities in the light path of the two oppositely directed light signals can be discontinuities in the light path, in particular at points at which two optical components of the optical series circuit are optically coupled to one another. Examples of such discontinuities are mutually tilted coupling faces, general manufacturing defects, and scattering effects or offsetting of fiber cores of optical fibers relative to one another. Particular problems can be caused by plug-in optical connections in the two transmission links for the detachable optical connection of two optical fibers. Such plug-in connections are advantageous for separating, on the one hand, the Faraday sensor device and, on the other hand, the electronic evaluation system, which are generally at different electric potentials. Even after opening a plug-in optical connection once and thereupon closing it, its attenuation characteristics can change by comparison with previous ones. The non-reciprocal changes in intensity are virtually completely eliminated by including the direct signal components of the two light intensities in the intensity normalization of the measuring signal.

In a particularly advantageous exemplary, a measuring signal is derived which is proportional to the signal $$[(I2_{DC} \cdot I1)-(I1_{DC} \cdot I2)]/[I2_{DC} \cdot I1)+(I1_{DC} \cdot I2)] \qquad (1)$$

formed from the two light intensities I1 and I2 and their two direct components $I1_{DC}$ and $I2_{DC}$.

In a further exemplary embodiment, the intensity-normalized measuring signal can also be derived with the aid of a control. For this purpose, a correction factor for one of the two light intensities is adapted, in particular by setting the amplification of a controllable amplifier for a corresponding electric intensity signal, until the difference between the direct component of the light intensity multiplied by the correction factor and the direct component of the other light lies within a prescribed tolerance range around zero. This difference between the direct components is thus the controlled variable of the control. By controlling the difference between the direct components to zero, the two direct components agree with respect to a prescribed tolerance. A signal proportional to the quotient of a difference between the light intensity multiplied by the correction factor and the other light intensity and a sum of the light intensity multiplied by the correction factor and the other light intensity is formed as measuring signal.

In an advantageous exemplary embodiment, the axes of polarization of the two polarizers are set by an angle of at least approximately an odd multiple of 45° or π/4. In this way, the operating point of the measuring method and of the measuring arrangement is set such that the measuring sensitivity is at a maximum.

The measuring method and the measuring arrangement are preferably used to measure an alternating electric field by arranging the Faraday sensor device in the alternating magnetic field of the alternating electric current and using the measuring signal as a measure of the alternating electric current. An alternating electric current is one whose spectrum has only frequency components differing from zero.

BRIED DESCRIPTION OF DRAWINGS

FIG. 1 shownns an exemplary embodiment of a measuring arrangment for measuring an alternating magnetic field and, in particular, the alternating magnetic field of an electric alternating current.

FIG. 2 shows an examplary embodiment of an evaluation unit of the measuring arrangement.

DETAILED DESCRIPTION OF THE INVENTION

Figure 1:
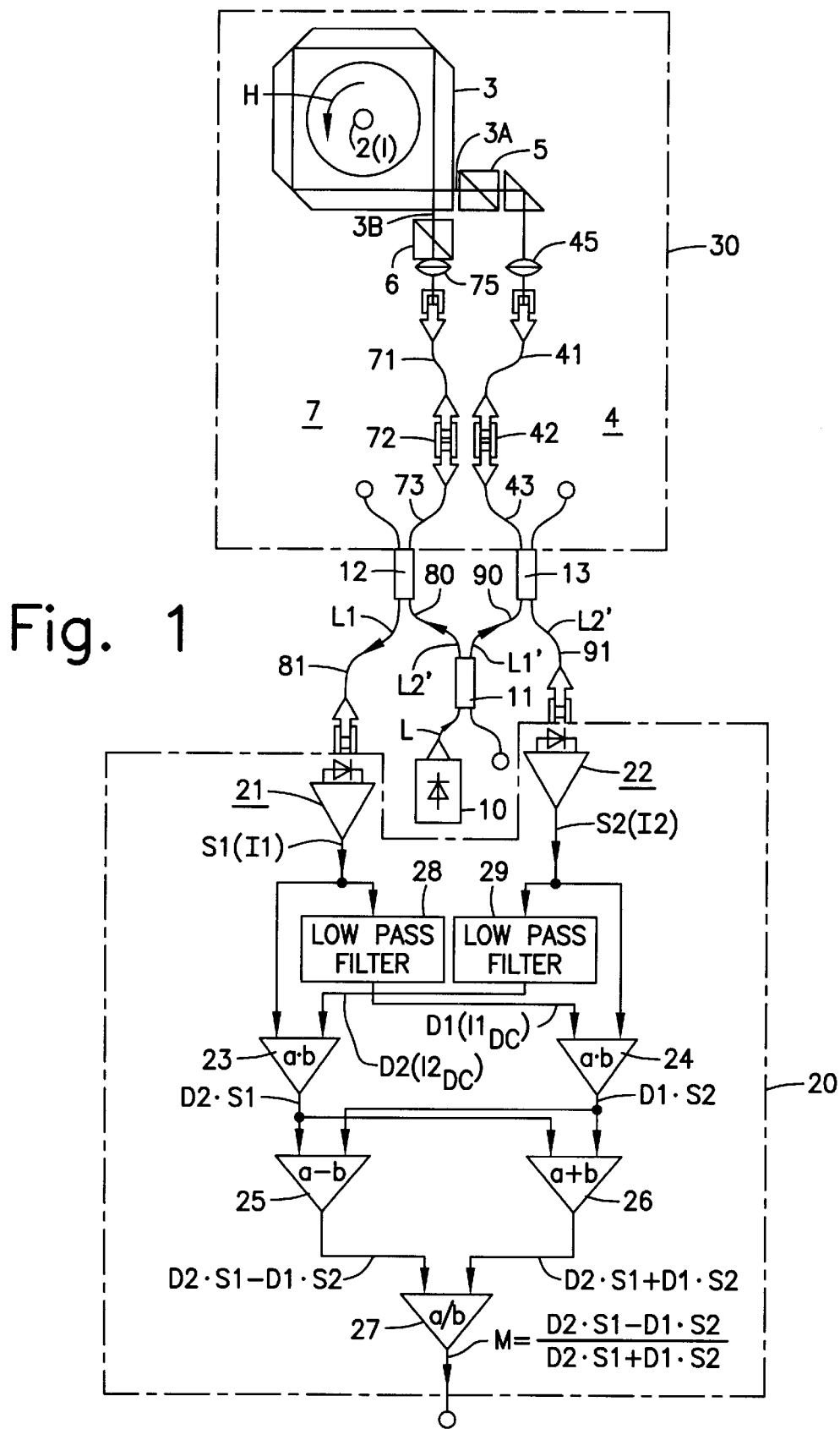

FIG. 1 shows a light source 10, a first optical coupler 11, a second optical coupler 12, a third optical coupler 13, an evaluation unit 20 and an optical series circuit 30. Connected optically in series in optical series circuit 30 are a first optical transmission link 4, a first polarizer 5, a Faraday sensor device 3 and a second optical transmission link 7. First optical coupler 11 is optically connected to light source 10 and splits light L from light source 10 into two light signals L1' and L2'. Second optical coupler 12 couples the end, facing sensor device 3, of second transmission link 7 of series circuit 30 to first optical coupler 11, on the one hand, and to a first photoelectric transducer 21 in evaluation unit 20, on the other hand. Third optical coupler 13 couples the end, remote from sensor device 3, of first transmission link 4 of series circuit 30 to first optical coupler 11, on the one hand, and to a second photoelectric transducer 22 in evaluation unit 20, on the other hand. Two light signals L1' and L2' are thus launched into optical series circuit 30 by first coupler 11 at mutually opposite ends via optical couplers 12 and 13, respectively. Two light signals L1' and L2' now traverse optical series circuit 30 in mutually opposite traversal directions. After transmission through series circuit 30, the light signals denoted by L1 and L2, respectively, are coupled out again from series circuit 30 and fed to evaluation unit 20 via respective optical couplers 13 and 12. The light intensities of two light signals L1' and L2' before launching into series circuit 30 are generally set at a permanently prescribed ratio relative to one another, which can he prescribed by the coupling ratios of couplers 11 to 13.

Light source 10 and couplers 11, 12 and 13 form a specific embodiment of a means for transmitting the two oppositely directed light signals L1' and L2' through series circuit 30. The couplers replaced, at least partially, by optical beam splatters, instead of light source 10, three couplers 11 to 13 and two transducers 21 and 22, it is also possible to provide light-emitting diodes which operate alternately as transmitters and detectors and are electrically connected to appropriate current sources and electronic evaluation systems. Two light signals L1' and L2' then traverse series circuit 30 sequentially in time.

In the advantageous exemplary embodiment represented, two optical transmission links 4 and 7 are of fiber-optic construction and, in each case, include two optical fibers 41 and 43, 71 and 73, respectively, which are connected to one another in a separable fashion via a plug-in optical connection 42 or 72, respectively. Such a plug-in connection 42 or 72 is advantageous in order to be able to separate sensor device 3, which is normally at high voltage during current measurement, from evaluation unit 20. A commercially available fiber plug-in connection complying with the FC Standard (OECA) can be used as plug-in connection 42 or 72.

Couplers 12 and 13 are now fiber couplers which, in each case, couple associated optical fibers 73 and 43, respectively, of second and first transmission links 7 and 4, respectively, to in each case two further optical fibers 80 and 81 or 90 and 91, respectively. Coupler 11 is now also a fiber coupler, which couples two optical fibers 80 and 90 to a further optical fiber (not designated) which transmits light L of light source 10. Optical fiber 80 transmits first light signal L1' before launching into series circuit 30. Optical fiber 90 transmits second optical signal L2' before launching into series circuit 30. Optical fiber 81 transmits first light signal L1 after coupling out from series circuit 30. Finally, optical fiber 91 transmits second light signal L2 after coupling out from series circuit 30. Optical fibers 41, 42, 71, 72, 80, 81, 90 and 91 can have their length adapted to the site conditions.

Faraday sensor device 3 contains at least one material exhibiting the magnetooptic Faraday effect. Under the influence of an alternating magnetic field H which at least partially penetrates sensor device 3, the polarization of linearly polarized light running through sensor device 3 is rotated because of the Faraday effect. Sensor device 3, in a manner known per se, can be constructed having one or more solid bodies, preferably made from glass, and, in particular as a solid glass ring as represented, having internal reflection surfaces which deflect light signals L1' and L2', or also having at least one optical fiber. Sensor device 3 has two optical connections 3A and 3B such that light launched at a connection 3A or 3B traverses sensor device 3 and is coupled out again, in each case, at other connection 3B or 3A. First connection 3A of sensor device 3 is optically coupled to one end of first optical transmission link 4 via first polarizer 5 and, preferably, via a collimator lens 45. Second connection 3B of sensor device 3 is optically coupled to one end of second optical transmission link 7 via second polarizer 6 and, preferably, via a further collimator lens 75.

In the measuring mode of the arrangement, first light signal L1' now traverses first transmission link 4 and is linearly polarized by first polarizer 5. The now linearly polarized light signal L1' is subsequently fed into sensor device 3 at connection 3A. Upon traversing sensor device 3, the plane of polarization of linearly polarized first light signal L1' is rotated by a Faraday measuring angle ρ which is a function of alternating magnetic field H. A positive angular value corresponds in this case and below to the mathematically positive direction of rotation, i.e., the counterclockwise direction, while a negative angular value corresponds to the mathematically negative direction of rotation, i.e., the clockwise direction, with reference to the direction of the light propagation of the light signal under consideration. First light signal L1', rotated in its plane of polarization by Faraday measuring angle ρ, is now fed to second polarizer 6. Second polarizer 6 passes only that component of incoming first light signal L1' which is projected along its polarization axis, and thus functions as a polarization analyzer for first light signal L1'. The component of first light signal L1' transmitted by second polarizer 6 is fed via second transmission link 7 and second coupler 12 to first transducer 21 as first light signal L1'. Second light signal L2' is fed via second transmission link 7 to second polarizer 5 and linearly polarized by the latter. Upon subsequently traversing sensor device 3, the polarization plane of linearly polarized second light signal L2' is rotated by a Faraday measuring angle ρ which is a function of alternating magnetic field H and, because of the non-reciprocal property of the Faraday effect, has the same absolute value as, but the opposite sign to, first light signal L1'. First polarizer 5 passes only that component of incoming second light signal L2' which is projected along its polarization axis, and thus acts for second light signal L2' as a polarization analyzer. The component of second light signal L2' transmitted by first polarizer 5 is transmitted via first transmission link 4 to second transducer 22 of evaluation unit 20 as a second light signal denoted by L2.

The polarization axes (transmission axes) of two polarizers 5 and 6 are preferably set in all the embodiments at a polarizer angle α which is an odd multiple of approximately 45° or approximately π/4. The operating point of the measurement is situated at maximum measuring sensitivity with such a setting.

The measuring arrangement represented is preferably provided for measuring an alternating electric current I in at least one electric conductor 2. Faraday sensor device 3 detects alternating magnetic field H generated inductively by this alternating current I and rotates the plane of polarization of two light signals L1' and L2' by a measuring angle ρ or −ρ which is a function of alternating magnetic field R and thus of alternating current 1. In the particularly advantageous exemplary embodiment represented, sensor device 3, in particular as a glass ring, surrounds electric conductor 2, with the result that two light signals L1' and L2' run round alternating current I in a virtually closed light path. Measuring angle ρ is directly proportional in this case to alternating electric current I.

The evaluation of two light signals L1 and L2 in evaluation unit 30 is preferably performed as follows. First photoelectric transducer 21 converts first light signal Li into a first electric intensity signal S1 which is essentially proportional to light intensity I1 of first light signal L1, i.e., S1=K1·I1. Second photoelectric transducer 22 converts second light signal L2 into a second electric intensity signal S2, which is essentially proportional to light intensity I2 of second light signal L2, S2=K2·I2. Proportionality factors K1 and K2 of these conversions are determined by the photoelectric efficiencies and the subsequent gains of the signals in transducers 21 and 22, and can vary, in particular also with time. Each of two intensity signals S1 and S2 is fed to an input of an associated first multiplier 23 or, respectively, second multiplier 24 and an input of an associated first filter 28 or, respectively, second filter 29 having a low-pass characteristic. First filter 28 forms a direct signal component D1 of first intensity signal S1 which corresponds to K1-fold direct component $I1_{DC}$ of light intensity I1 of first light signal L1, i.e., D1=K1·$I1_{DC}$. Direct signal component D1, present at the output of filter 28, of first intensity signal S1 is fed to a second input of first multiplier 23. Second filter 29 forms a direct signal component D2 of second intensity signal S2 which corresponds to K2-fold direct component $I2_{DC}$ of light intensity I2 of second light signal L2, i.e., D2=K2·$I2_{DC}$. Direct signal component D2, present at an output of second filter 29, of second intensity signal S2 is fed to a second input of second multiplier 24. For example, it is possible to use as filters 28 or 29 low-pass filters whose cut-off frequencies are, in each case, set below the lowest frequency in the spectrum of alternating magnetic field H or alternating electric current I. Two direct signal components D1 and D2, and two direct light components $I1_{DC}$ and $I2_{DC}$ thus contain no information on alternating magnetic field H or alternating electric current I, but precisely the information on an undesired direct drift (operating point drift) of two light intensities I1 and I2. This information on a drift in intensity is now used as follows for intensity normalization. First multiplier 23 forms product D2·S1 of first intensity signal S1 and direct signal component D2 of second intensity signal S2. Second multiplier 24 forms product D1·S2 of direct signal component D1 of first intensity signal S1 and second intensity signal S2. These two products D2·S1 and D1·S2 are now fed from the output of corresponding multiplier 23 and 24, respectively, to one input each of a subtractor 25 and to one input each of an adder 26. Differential signal D2·S1−D1·S2 formed by subtractor 25 from two product signals D2·S1 and D1·S2 are applied at a first input of a divider 27. Sum signal D2·S1⇋D1·S2 of the two products D2·S1 and D1·S2 which is formed by adder 26 is present at the second input of divider 27. Measuring signal $$M=[(D2 \cdot S1)-(D1 \cdot S2)]/[(D2 \cdot S1)+(D1 \cdot S2)] \quad (2)$$

can now be tapped at an output of divider 27 for alternating magnetic field H or for electric current I; it corresponds to the quotient signal from the difference D2·S1−D1·S2 and the sum D2·I1+D1·I2.

In a modified exemplary embodiment of the signal evaluation in evaluation unit 20, a first step is to determine a quotient of two direct signal components D1 and D2 as correction factor K=D1/D2. A measuring signal $$M'+[S1=(K \cdot S2)]/[S1+(K \cdot S2)] \quad (3)$$

is formed using this correction factor K.

two measuring signals M according to Equation (2) and M' according to Equation (3) are both equal to the quotient formed according to Equation (1) directly from light intensities I1 and I2 and their direct components $I1_{DC}$ and $I2_{DC}'$. It therefore holds that:

$$M=M'=[(I1 \cdot I2_{DC})-(I2 \cdot I1_{DC})]/[(I1 \cdot I2_{DC})+(I2 \cdot I1_{DC})] \quad (4)$$

sensitivities K1 and K2 of two transducers 21 and 22 thus drop out when measuring signal M is formed according to Equation (2), or when measuring signal MI is formed according to Equation (3).

Figure 2:
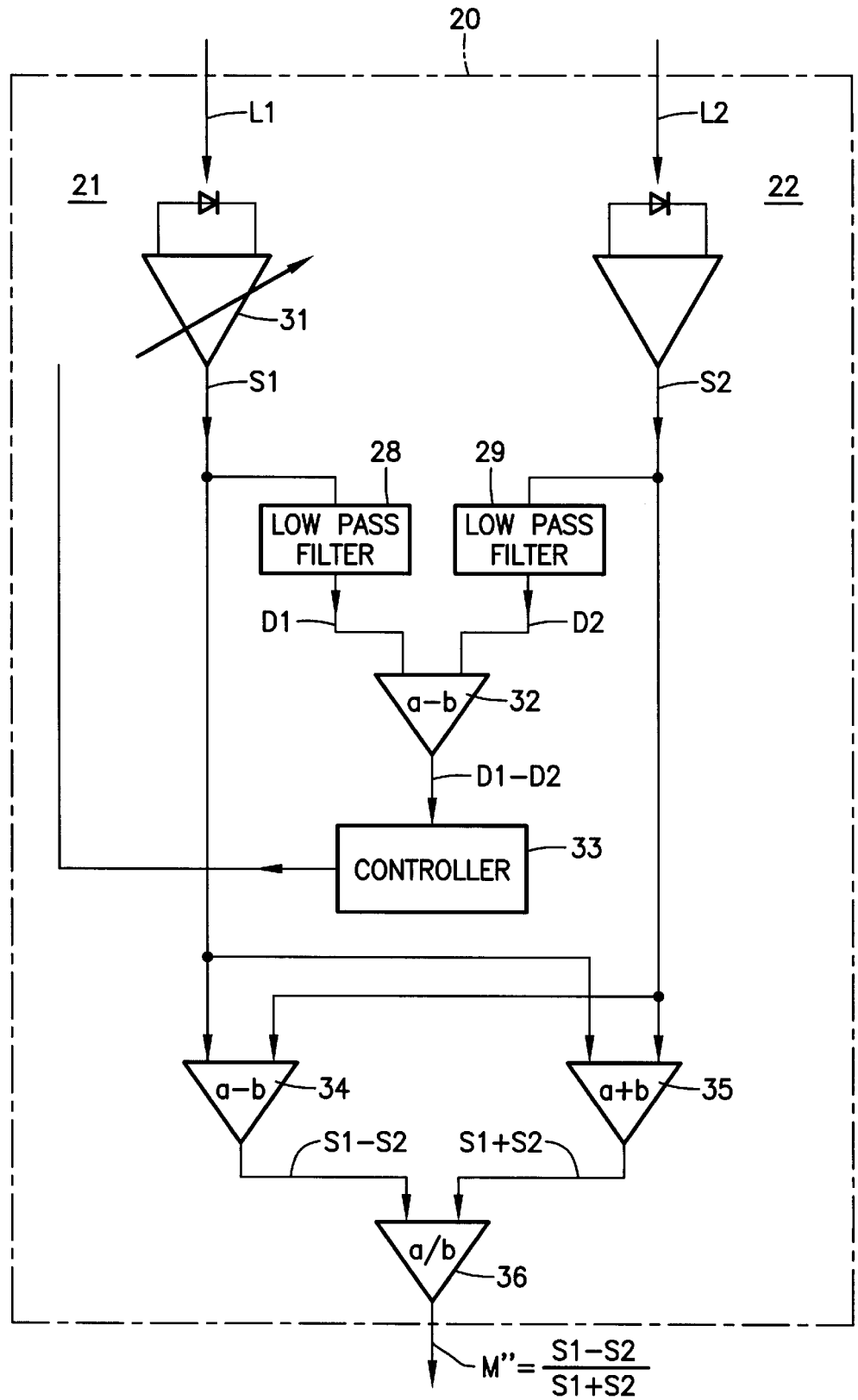

FIG. 2 shows a further exemplary embodiment of evaluation unit 20 for deriving an intensity-normalized measuring signal M" from intensity signals S1=K1·I1 and S2 K2−I2 and their direct signal components D1=K1·$I1_{DC}$ and D2=K2·$I2_{DC}$, respectively. Evaluation unit 20 contains a control loop having a controller 33 and a controllable amplifier 31 as actuator which is triggered by controller 33. Controllable amplifier 31 is either a component part of one of the two photoelectric transducers, or is connected downstream of one of the two photoelectric transducers. In the exemplary embodiment represented, controllable amplifier 31 is part of first photoelectric transducer 21 and is connected downstream of a photodiode as photodetector, for the purpose of amplifying the signal of the photodiode. The amplitude of first intensity signal S1 at the output of transducer 31 can thus be controlled by controlling the gain factor of controllable amplifier 31. This corresponds to controlling proportionality factor (correction factor) K1 via which intensity signal S1 is proportional to light intensity I1. Second transducer 22 also preferably contains a photodiode and a downstream amplifier having a permanently set gain. Proportionality factor K2 of second intensity signal S2 is thus not changed. The evaluation unit again further contains two filters 28 and 29 for forming direct signal components D1 and D2 of two intensity signals S1 and S2, which are present at the outputs of transducers 21 and 22, respectively, as well as a subtractor 32, connected to the outputs of two filters 28 and 29, for forming difference D1−D2 between two direct signal components D1 and D2. This difference D1−D2 is fed to controller 33 as controlled variable. Controller 33 compares controlled variable D1−D2 with a zero signal as desired value, and controls the gain of controllable amplifier 31 until the system deviation between controlled variable D1−D2 and the desired value 0 lies within a prescribed tolerance range. Two direct signal components D1 and D2 are therefore equal in the adjusted state, i.e., $$K1 \cdot I1_{DC}=K2 \cdot I2_{DC} \quad (5).$$

A measuring signal $$M'' = (S1 - S2)/(S1 + S2) \quad (6)$$
$$= [(K1 \cdot I1) - (K2 \cdot I2)]/(K1 \cdot I1) + (K2 \cdot I2)]$$

which corresponds to the quotient of difference S1−S2 and sum S1+S2 of two intensity signals S1 and S2 at the outputs of transducers 21 and 22 is now formed from first intensity signal S1 set via this control and second intensity signal S2, which is not changed by the control. For the formation of this measuring signal M" provision is made for a subtractor 34 for forming difference S1−S2, an adder 35 for forming sum S1+S2 and a divider 36 for forming the quotient signal from difference S1−S2 and sum S1+S2 as measuring signal M" in evaluation unit 20.

Instead of using analog arithmetic modules as represented, it is also possible to use a value table and/or digital modules to assist evaluation unit 20 in determining measuring signal M according to Equation (2), or measuring signal M' according to Equation (3), or measuring signal M" according to Equation (6). Two electric intensity signals S1 and S2 are then firstly digitized with the aid of an analog to-digital converter, and the digitized signals are further processed by a microprocessor or a digital signal processor for measuring signal M or M".

Measuring signal M or M", respectively, determined according to one of Equations (2) to (4) or Equation (6) is virtually completely intensity-normalized. Thus undesired changes in light intensities I1 and I2 of two light signals L1 and L2 based on transmission losses due to attenuation, reflections, or scattering in series circuit 30, or based on vibrations or mechanical bending in particular in two transmission links 4 and 7, no longer affect measuring signal M or M' or M". Scattering effects and reflections can occur, in particular, at connections 3A and 3B of sensor device 3, as well as at plug-in connections 42 and 72. The complete intensity normalization of measuring signal M or M' or M" can be detected by taking account of the changes in intensity in series circuit 30 using additional transmission factors C1 and C2 in light intensities I1 and I2. The (real) transmission factor, generally a function of time, of an optical transmission link is taken to be the ratio of the light intensity of light incident at one end of the transmission link to the input light intensity of the light when launched into the other end of the transmission link. It then holds for light intensities I1 and I2 of two light signals L1 and L2 after traversal of optical series circuit 30 that:

$$I1 = B1 \cdot C1 \cdot I0 \cdot \cos^2(\rho + \alpha) \quad (7)$$

$$I2 = B2 \cdot C2 \cdot I0 \cdot \cos^2(\rho - \alpha) \quad (8).$$

I0 is the light intensity of light L of light source 10. B1 and B2 are coupling factors which are yielded from the coupling ratios of couplers 11, 12 and 13. If the coupling ratios of all couplers 11, 12 and 13 are 50%:50% in each case, B1+B2. The $\cos^2$ terms in Equations (7) and (8) describe the dependence of light intensity I1 or I2, respectively, on Faraday measuring angle $\rho$ for a prescribed polarization angle $\alpha$. Linear birefringence effects in sensor device 3 are negligible in this case. It follows from Equations (7) and (8) that:

$$I1_{DC} = B1 \cdot C1 \cdot I0 \cdot (\cos^2(\rho + \alpha))_{DC} \quad (9)$$

$$I2_{DC} = B2 \cdot C2 \cdot I0 \cdot (\cos^2(\rho - \alpha))_{DC} \quad (10)$$

for direct components $I1_{DC}$ and $I2_{DC}$ of two light intensities I1 and I2.

Substituting Equations (7) to (10) in Equation (4) or in Equation (6) while taking account of Equation (5) yields as measuring signal $$M = M' = M'' = \sin(2\alpha) \cdot \sin(2\rho) \quad (11)$$

since $(\cos^2(\rho+\alpha))_{DC} (\cos^2(\rho+\alpha))_{DC} \cdot M = M' = M'' = \sin(2\rho)$ for preferred polarizer angle $\alpha = \pm 45°$. Factors B1, B2, C1, C2 and I0 influencing the intensity are eliminated upon substitution.

It is thus possible in all the exemplary embodiments also to use simple, comparatively cost-effective telecommunication optical fibers (multimode fibers) as optical fibers 41, 43, 71 and 73, since the relatively high attenuations and vibration sensitivities of the latter are compensated in the measuring signal. However, it is also possible to use other optical fibers or free-beam arrangements as transmission links 4 and 7.

Alternating electric current I in electric conductor 2 can then be determined from measuring signal M or M M" with the aid of relationship $\rho = NVI$ with Verdet's constant V of the Faraday effect in sensor device 3 and number N of revolutions of light signals L1' and L2' around electric conductor 2.

Temperature influences in sensor device 3 can pose an additional problem in measuring an alternating magnetic field H or an alternating electric current I in accordance with one of the described measuring methods or one of the described measuring arrangements. These temperature influences induce a linear birefringence $\delta$ as a function $\delta(T)$ of temperature T in sensor device 3, which can falsify the measurement of alternating magnetic field H or alternating electric current I. Furthermore, temperature changes can also change Verdet's constant and thus the measuring sensitivity.

The temperature dependence of measuring signal M, M' or M" is now essentially eliminated with the measures for temperature compensation which are described below. The polarization axes of two polarizers 5 and 6 are set at a polarizer angle $\gamma$ (not represented) to an intrinsic axis (main axis, optical axis) of linear birefringence $\delta$ in sensor device 3. Polarizer angle $\gamma$ is determined at least approximately in accordance with the equation $$\cos(4\gamma - 2\alpha) = -\tfrac{2}{3} \quad (12).$$

An intrinsic axis of linear birefringence $\delta$ is defined in this case by that direction of polarization at which linearly polarized light launched into sensor device 3 leaves sensor device 3 again unchanged. If, by contrast, linearly polarized light is launched into sensor device 3 with a plane of polarization which is not directed parallel to one of the intrinsic axes of sensor device 3, the light is elliptically polarized upon traversing sensor device 3 because of linear birefringence $\delta$. The two generally mutually orthogonal intrinsic axes of linear birefringence $\delta$ can be determined in a way known per se. For example, sensor device 3 can be arranged between a polarizer, for example polarizer 5, and an analyzer, for example polarizer 6. The polarization axes of the two polarizers are set in a mutually perpendicular fashion. In one exemplary embodiment, the two polarization axes of the polarizer and analyzer are rotated in the same direction with respect to a reference axis of sensor device 3, until the intensity of the light transmitted by the analyzer is equal to zero (maximum light extinction). The intrinsic axes are then parallel to the two polarization axes of the polarizer and analyzer. As an alternative to this, in another exemplary embodiment the two polarization axes can also be rotated in the same direction relative to the reference axis of sensor device 3 until the intensity of the light transmitted by the analyzer is at a maximum (minimum light extinction). In this case, the light is circularly polarized upon emerging from sensor device 3. The intrinsic axes of linear birefringence $\delta$ are then offset by 45° and -45°, respectively, relative to the polarization axis of the analyzer.

If the preferred rotational angle is selected as a $\alpha = -45°$ or $\alpha = -45° - n \cdot 180° = -(1+4n) \cdot 45°$ with the arbitrary whole number n, Equation (12) is reduced to $$\sin(4\gamma) = +\tfrac{2}{3} \quad (13).$$

A possible value, satisfying Equation (13), for polarizer angle $\gamma$ is, for example, $\gamma = +10.45°$. In the case of rotational angle $\alpha = +45°$ or a $\alpha = +(1+4n) \cdot 45°$ with the arbitrary whole number n, Equation (12) is reduced, by contrast, to $$\sin(4\gamma) = -\tfrac{2}{3} \quad (14)$$

A polarizer angle $\gamma$ which satisfies Equation (14) is, for example, $\gamma = 10.45°$.

Deviations from angular values for polarizer angle α which exactly satisfy Equation (11), (12), (13) or (14) are possible, in particular in the case of inhomogeneous linear and/or circular birefringence and/or a strongly temperature-dependent Verdet's constant in sensor device 3, and can amount in general to about 5°. Rotational angle α can also deviate by up to about ±10° from its ideal value α=+(1+4n)·45° or α(1+4n) =−(1+4n)·45° for the temperature compensation.

The measuring signal determined with a polarizer angle γ set at least approximately in accordance with Equation (11), (12), (13) now essentially corresponds, even in the case of varying temperatures in sensor device 3, to the measuring signal proportional to sin (2ρ) without linear birefringence δ. polarizer angle γ, optimal in accordance with Equation (11), (12), (13), of two polarizers 5 and 6 relative to the intrinsic axis of linear birefringence δ can be set simply in a special embodiment so that in a calibration measurement the measuring signal is compared as a function of temperature with its expected desired value without linear birefringence δ for a prescribed polarizer angle γ as parameter, and polarizer angle γ is varied until current measuring signal M, M' or M" corresponds to the virtually temperature-independent desired value. The bandwidth of the measurement is not reduced by the above-described temperature compensation.

We claim:

1. A method for measuring an alternating magnetic field of an alternating electric current, comprising the steps of:
    a) traversing an optical series circuit using a first light signal in a first direction and using a second light signal in a second direction, the second direction being opposite to the first direction, the optical series circuit including a first optical transmission link, a first polarizer, a sensor device exhibiting a Faraday effect, a second polarizer, and a second optical transmission link;
    b) after the step (a), converting a first light intensity of the first light signal into a first electrical intensity signal and converting a second light intensity of the second light signal into a second electrical intensity signal, the first electrical intensity signal being proportional to the first light intensity and the second electrical intensity signal being proportional to the second light intensity;
    c) low-pass filtering the first electrical intensity signal to form a first direct signal component and low-pass filtering the second electrical intensity signal to form a second direct signal component, the first direct signal component being proportional to a first direct light component of the first light intensity and the second direct signal component being proportional to a second direct light component of the second light intensity, the first and second direct light components lacking frequency components of the alternating magnetic field; and
    d) forming a measuring signal for the alternating magnetic field using the first and second electrical intensity signals and the first and second direct signal components, the measuring signal being substantially independent of intensity changes in the optical series circuit.

2. The method according to claim 1, wherein the measuring signal is proportional to a first formula:
    and wherein I1 is the first light intensity,
        $I1_{DC}$ is the first direct component,
        I2 is the second light intensity and
        $I2_{DC}$ is the second direct component.

3. The method according to claim 1, further comprising the steps of:
    e) multiplying the first direct component by a correction factor to determine a resulting value, the correction factor being adapted until a difference value between the resulting value and a value of the second direct component is within a predetermined range having tolerance of approximately zero, and
    f) determining the second measuring signal, the second measuring signal being proportional to a second formula:
    and wherein I1 is the first light intensity, I2 is the second light intensity and K is the correction factor.

4. The method according to claim 1, further comprising the step of:
    rotating a first polarization axis of the first polarizer by an angle of at least approximately 45° relative to a second polarization axis of the second polarizer.

5. The method according to claim 1, further comprising to the step of:
    measuring the alternating magnetic field using the first and second measuring signals as a measure value of the alternating electric current.

6. An arrangement for measuring an alternating magnetic field of an alternating electric current, comprising:
    a) an optical series circuit including a first optical transmission link, a first polarizer, a sensor device exhibiting a Faraday effect, a second polarizer and a second optical transmission link;
    b) a transmitting arrangement for transmitting a first light signal through the optical series circuit in a first direction and transmitting a second light signal through the optical series circuit in a second direction, the second direction being opposite to the first direction;
    c) a converting arrangement for converting a first light intensity of the transmitted first light signal into a first electrical intensity signal, and for converting a second light intensity of the transmitted second light signal into a second electrical intensity signal, the first electrical intensity signal being proportional to the first light intensity, and the second electrical intensity signal being proportional to the second light intensity signal;
    d) a first low-pass filter and a second low-pass filter for respectively forming a first direct signal component from the first electrical intensity signal and a second direct signal component from the second electrical intensity signal, the first direct signal component being proportional to a first direct light component of the first light intensity and the second direct signal component being proportional to a second direct light component of the second light intensity, the first and second direct light components lacking frequency components of the alternating magnetic field; and
    e) an evaluation device for determining a measuring signal for the alternating magnetic field as a function of the first and second electrical intensity signals and the first and second direct signal components, the measuring signal being substantially independent of intensity changes in the optical series circuit.

7. The arrangement according to claim 6, wherein the measuring signal is proportional to a first formula:
    wherein I1 is the first light intensity,
        $I1_{DC}$ is the first direct component,
        I2 is the second light intensity, and
        $I2_{DC}$ is the second direct component.

8. The arrangement according to claim 6, wherein the evaluation device includes:
   a) a controller device controlling a difference value to a predetermined range having tolerance of approximately zero by setting a correction factor, the difference value being determined as a difference between the first direct component multiplied by the correction factor and the second direct component, and
   b) an arrangement for determining the second measuring signal, the second measuring signal being proportional to a second formula: and wherein I1 is the first light intensity, I2 is the second light intensity and K is the correction factor.

9. The arrangement according to claim 6, wherein a first polarization axis of the first polarizer is rotated by an angle of at least approximately 45° relative to a second polarization axis of the second polarizer.

10. The arrangement according to claim 6, wherein the sensor device is positioned in the alternating magnetic field and the evaluating device determines the first measuring signal as a function of a measured value of the alternating electric current.

11. The arrangement according to claim 6, wherein each of the first and second optical transmission links includes at least one optical fiber.

12. The arrangement according to claim 11, wherein each of the first and second optical transmission links includes at least two optical fibers and an optical multiple connection for detachably connecting the at least two optical fibers.

* * * * *